United States Patent
Feldtkeller

(10) Patent No.: US 9,602,162 B2
(45) Date of Patent: Mar. 21, 2017

(54) METHOD FOR DATA TRANSMISSION

(71) Applicant: INFINEON TECHNOLOGIES AG, Neubiberg (DE)

(72) Inventor: Martin Feldtkeller, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/875,728

(22) Filed: Oct. 6, 2015

(65) Prior Publication Data
US 2016/0028440 A1  Jan. 28, 2016

Related U.S. Application Data

(62) Division of application No. 14/305,008, filed on Jun. 16, 2014, now Pat. No. 9,197,291.

(60) Provisional application No. 61/835,745, filed on Jun. 17, 2013.

(51) Int. Cl.
| | |
|---|---|
| H04B 3/56 | (2006.01) |
| H03K 5/26 | (2006.01) |
| H03K 5/06 | (2006.01) |
| H03K 5/1534 | (2006.01) |
| H03K 5/00 | (2006.01) |

(52) U.S. Cl.
CPC ............. *H04B 3/56* (2013.01); *H03K 5/06* (2013.01); *H03K 5/065* (2013.01); *H03K 5/1534* (2013.01); *H03K 5/26* (2013.01); *H03K 2005/00143* (2013.01); *H04B 2203/5483* (2013.01)

(58) Field of Classification Search
CPC ........ H03K 5/06; H03K 5/065; H03K 5/1534; H03K 5/26; H04B 5/56
See application file for complete search history.

(56) References Cited

U.S. PATENT DOCUMENTS

| | | | |
|---|---|---|---|
| 5,574,441 A | 11/1996 | Roes et al. | |
| 2002/0012257 A1 | 1/2002 | Takahama et al. | |
| 2005/0094420 A1 | 5/2005 | Nakao et al. | |
| 2009/0212759 A1* | 8/2009 | Melanson | H03K 17/691 |
| | | | 324/76.11 |
| 2009/0257259 A1 | 10/2009 | Leibovitz | |
| 2012/0193993 A1 | 8/2012 | Azancot et al. | |

FOREIGN PATENT DOCUMENTS

| | | |
|---|---|---|
| CN | 1329388 A | 1/2002 |
| CN | 102084442 A | 6/2011 |
| WO | 2009116025 A2 | 9/2009 |

OTHER PUBLICATIONS

Finkenzeller, "RFID-Handbuch", 2012, pp. 88-92 and 113-115, Carl Hanser Verlag, Munich, Germany (for reference purposes only).

* cited by examiner

*Primary Examiner* — Leon Flores
(74) *Attorney, Agent, or Firm* — Viering, Jentschura & Partner mbB

(57) ABSTRACT

A method for transmitting data in a direction of transmission of a clock signal, wherein positive and negative edges of the clock signal are transmitted by pulses with opposite polarity, wherein the polarity of the pulses is not inverted when no data is transmitted, and wherein the polarity of at least one pulse is inverted when data is transmitted.

20 Claims, 12 Drawing Sheets

METHOD FOR DATA TRANSMISSION

CROSS REFERENCE TO RELATED APPLICATION

This is a divisional of application Ser. No. 14/305,008, filed on Jun. 16, 2014, which is related to and claims the benefit of U.S. Provisional Application No. 61/835,745 filed on Jun. 17, 2013, which are both hereby incorporated by reference in their entirety.

TECHNICAL FIELD

Various embodiments generally relate to the transmission of clock signals and data signals across an electrically isolating interface. The electrically isolating interface may be a transformer, for example a coreless transformer. The clock signal may be transmitted in one direction and the data signal may be transmitted in the same or an opposite direction across the interface. The transmission of the data signal and the clock signal may be synchronized.

BACKGROUND

Various embodiments may be used in products in which energy may be transmitted via another coreless transformer. Due to the poor efficiency of the energy transmission, it is desired that the power consumption of the side that receives the clock signal and sends the data signals should be low. An example of such a product may be an electrically isolated analog-to-digital converter (ADC) with an integrated electrically isolated power supply. The transmitted clock signal may be used as the clock signal of the analog-to-digital converter. The analog-to-digital converter may be a sigma-delta-converter. The data signals to be transmitted in the other direction maybe the data provided by one or two sigma-delta-converters. The transmissions in both directions should robust with respect to common mode signals at the electrically isolated interface. In particular, the clock signal should be transmitted in a manner robust enough that common mode signals do not impart additional jitter on it.

SUMMARY

Various embodiments for transmitting edges of a clock signal to a receiver may apply edges of opposite polarities at a primary coil (or at a pair of primary coils) of a transformer. For an inverted edge of the clock signal inverted polarities may be applied. Before transmitting an edge of a clock signal, the primary coil(s) may be magnetized in opposite directions. The time needed for magnetization may be longer than the L/R time constant of the primary coil(s). After transmitting the edge of the clock signal, the primary coil(s) may be demagnetized. Drivers with symmetric impedance may be used for magnetizing and demagnetized the coils in order to avoid common mode signals being converted into differential signals between the two transformers.

The demagnetization does not have to reach zero; it may be stopped at a small value. By then turning off the driver the magnetization may jump to zero, which may induce an oscillation in the pair of transformers at its resonance frequency. The resonance frequency may be lowered by providing an additional capacitor in the resonant circuit. The damping of the resonant circuit or of the oscillation may be partially or fully compensated by providing a circuit with a negative differential resistance. The oscillation in the pair of transformers may then last for a longer time or be undamped.

The damping of the resonant circuit may be increased from the secondary side by a switch for short-circuiting the secondary coils. The resultant damping should be large enough so that the induced oscillation can be damped fast enough even when a circuit with a negative differential resistance is present. At the primary side, it may be detected if and how fast the oscillation decays, for example with the help of an amplitude detector or by counting the number of oscillations exceeding a given amplitude.

Opening and closing the switch can be performed with a very low power consumption and may allow the transmission of a bit with every edge of a clock signal. Two bits may therefore be transmitted during a clock period. The transmission is very robust against common mode signal interference because of the symmetric construction of the pair of transformers and the high resonance frequency.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number can identify the drawing in which the reference number first appears. The same numbers can be used throughout the drawings to reference like features and components. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
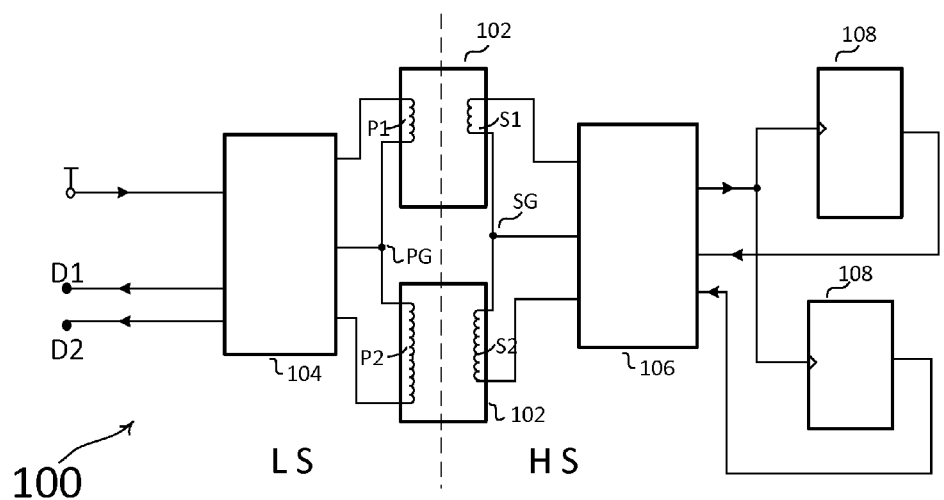
FIG. 1 shows an embodiment of a transformer arrangement.

FIG. 1 shows an embodiment of a transformer arrangement 100 for bidirectional signal transmission. The transformer arrangement 100 may have a low side LS and a high side HS. The low side LS and the high side HS may be electrically isolated from another by at least one transformer 102. A clock signal T on the low side LS may be used to generate a clock signal t on the high side HS. Data signals d1, d2 on the high side HS may be used to generate data signals D1, D2 on the low side LS. The high side HS may have one or two analog-to-digital converters 108, which may provide data signals d1, d2. They may be clocked by clock signal t, which may be based on clock signal T. The data signals may be synchronized with the clock signals.

The at least one transformer 102 may have a plurality of transformers. The following embodiments have two transformers 102, though a different number of transformers can be used. Each transformer 102 may have a primary coil P1, P2 and a secondary coil S1, S2. The primary coils P1, P2 may be arranged on the low side LS or primary side and secondary coils S1, S2 may be arranged on the high side HS or secondary side. The primary coils P1, P2 of the plurality of transformers may be connected in series. A node PG between the primary coils P1, P2 may be connected to a reference voltage. The secondary coils S1, S2 of the plurality of transformers may be connected in series. A node SG between the secondary coils S1, S2 may be connected to another reference voltage. A high symmetry of the transformers 102 may lead to a good rejection of common mode interference. However, embodiments with only one transformer 102 can also be used. The transformer 102 may be a coreless transformer.

The low side LS may have a low side circuit 104. The low side circuit 104 may have an input for a clock signal T and two data outputs D1, D2. It may further be connected to the primary coils P1, P2 and the node PG. The high side HS may have a high side circuit 106. The high side circuit 106 may have an output for a clock signal t and two data inputs d1, d2. It is further connected to the secondary coils S1, S2 and the node SG.

Figure 2:
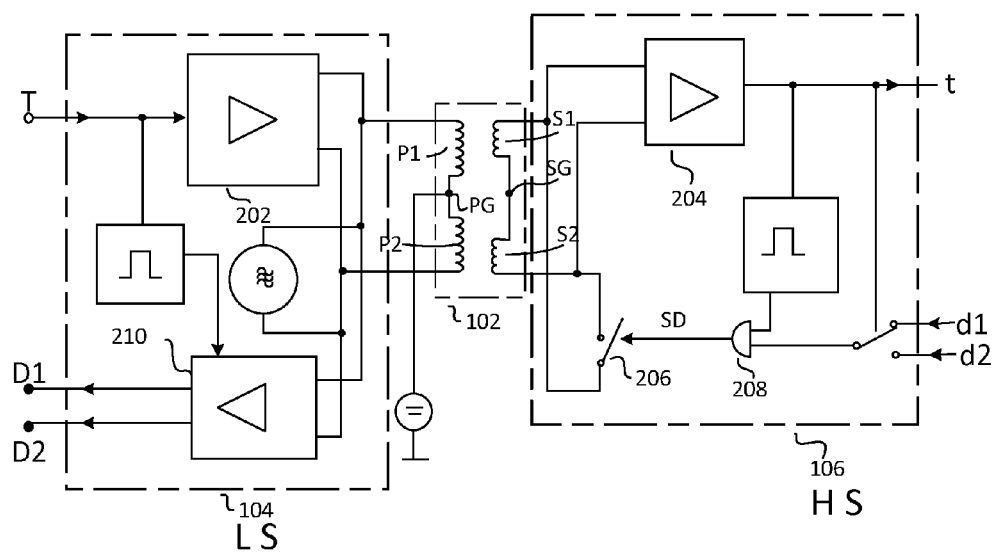
FIG. 2 shows an embodiment with details of a transformer arrangement.

FIG. 2 shows an embodiment with details of the low side circuit 104 and the high side circuit 106. The low side circuit 104 may have a controller 202. The high side circuit 106 may have a receiving circuit 204.

The controller 202 may be coupled to the primary coils P1, P2. It may be used as a driver for the primary coils P1, P2, for example for transmitting a clock signal across the transformer 102. The transmission may involve a magnetization phase MP, a voltage application phase VP, and a demagnetization phase DP. In the magnetization phase MP, resistances may be coupled between the primary coils P1, P2 and a supply voltage step-by-step in parallel. In the voltage application phase VP, which may also be called an impulse phase, the voltage at the primary coils P1, P2 and the current through the primary coils may change polarity. In the demagnetization phase DP, the resistances between the primary coils P1, P2 and the supply potential may be step-by-step disconnected.

The controller 202 may be configured in a magnetization phase MP to control a first current to flow through the primary coil P1, P2 to increase until a predefined criterion is fulfilled. The magnetization phase MP may be longer than a time constant TP=L/R of the primary coil P1, P2 of the transformer 102. L may be the inductance of the primary coil P1, P2 and R the resistance of the primary coil P1, P2. The magnetization phase MP may, for example, be longer than two times the time constant TP of the primary coil P1, P2 of the transformer 102. The controller 202 may be configured such that the time for the magnetization phase MP lies in the range from about 5 ns to about 30 ns. For example, it may be in the range from about 7 ns to about 20 ns. For example, it may be in the range from about 9 ns to about 15 ns. For example, it may be about 10 ns.

The time constant TP=L/R TP of the primary coil P1, P2 of the transformer 102 may be in the range from about 1 ns to about 10 ns. For example, it may be in the range from about 2 ns to about 6 ns. For example, it may be in the range from about 3 ns to about 4 ns. The controller 202 may be further configured to, in a voltage application phase VP, apply a voltage to the transformer 102 so that a second current flows through the primary coil P1, P2. The second current may magnetize the transformer 102. The second current may have a polarity which changes during the voltage application phase VP when compared to the polarity of the first current. The voltage application phase VP may be shorter than two times the time constant TP of the primary coil P1, P2 of the transformer 102. It may, for example, be shorter than the time constant TP of the primary coil P1, P2 of the transformer 102. The controller 202 may be configured such that the time for the voltage application phase VP is in the range from about 0.5 ns to about 6 ns. For example, it may be in the range from about 1 ns to about 4 ns. For example, it may be in the range from about 2 ns to about 3 ns.

The controller 202 may be further configured, in a demagnetization phase DP, to control a third current flowing through the primary coil P1, P2 to decrease. The third current may demagnetize the transformer 102. The demagnetization phase DM may be longer than the time constant TP of the primary coil P1, P2 of the transformer 102. It may, for example, be longer than two times the time constant TP of the primary coil P1, P2 of the transformer 102. The controller 202 may be configured such that the time for the demagnetization phase DP is in the range from about 5 ns to about 30 ns. For example, it may be in the range from about 7 ns to about 20 ns. For example, it may be in the range from about 9 ns to about 15 ns. For example, it may be about 10 ns.

Figure 3:
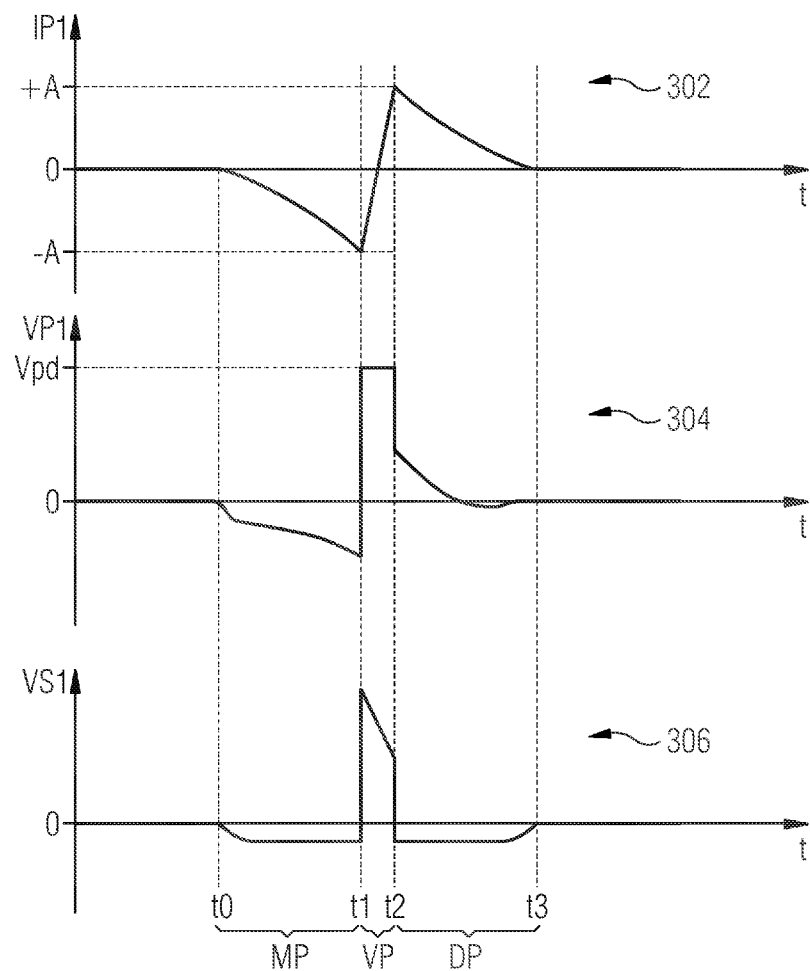
FIG. 3 shows examples of signal sequences of a transformer arrangement.

FIG. 3 shows examples of a signal sequence 302 of a current IP1 flowing through the primary coil P1, a signal sequence 304 of a voltage VP1 across the primary coil P1 and a signal sequence 306 of a voltage VS1 across the secondary coil S1. The signal sequences 302, 304 and 306 may correspond to a magnetization phase MP from time t0 to t1, a voltage application phase VP from time t1 to t2 and a demagnetization phase DP from time t2 to t3.

At time t0, the current IP1 through the primary coil P1 may start to slowly increase in negative direction. It may increase until it reaches a negative maximum at time t1. The time period between t1 and t0 may be larger than the time constant TP=L/R of the primary coil P1. The increase in current IP1 may be chosen so that only a small and approximately constant negative voltage VS1 is present at the secondary coil S1.

At time t1, the primary coil P1 may be connected to a predefined voltage Vpd, for example a supply voltage. It may remain connected until time t2, see signal sequence 304. The time period between t1 and t2 may be shorter than the time constant TP=L/R of the primary coil P1. It may be chosen so that current IP1 has opposite polarities, for example with the same magnitude, at times t1 and t2. For example, at time t1, IP1 may be negative and have a magnitude −A, and at time t2, IP1 may be positive and have a magnitude +A. As a result, a large positive pulse may be induced in secondary coil S1, see signal sequence 306. The pulse may decline exponentially.

At time t2, the current IP1 through the primary coil P1 may start to slowly decrease towards zero. It may reach at value of zero at time t3. The time period between t2 and t3 may be larger than the time constant TP=L/R of the primary coil P1. The decrease in current IP1 may be chosen so that only a small and approximately constant negative voltage VS1 is present at the secondary coil S1.

Magnetizing the transformer in an opposite direction before inducing the pulse in the secondary coil S1 may have the advantage that the maximum current that needs to be supplied by the power supply may be reduced. Further, the ratio of the voltage induced in the secondary coil in the opposite direction to the amount of charge supplied by the power supply is higher.

Every signal sequence IP1, VP1, VS1 may have a complementary signal sequence IP2, VP2, VS2 in case the transformer 102 is symmetric, that is, it has two complimentary primary coils P1, P2 and two complimentary secondary coils S1, S2. When no common mode interference is present and if the current flowing into the primary coil P1 is the same as the current flowing out of the primary coil P2, no current will flow through the common node PG. The controller 202 is responsible to achieve the signal sequences shown in FIG. 3.

Figure 4:
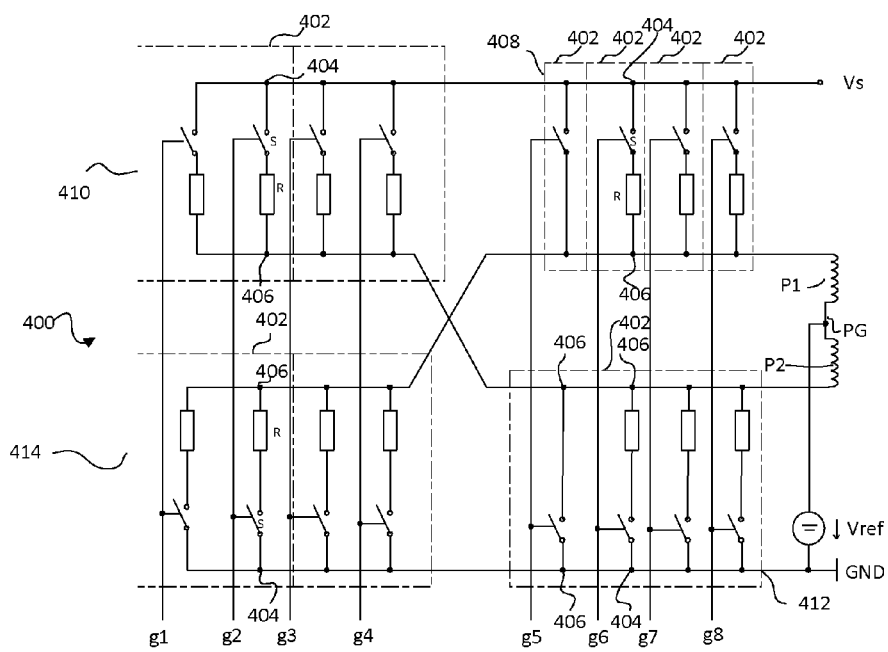
FIG. 4 shows an embodiment of a circuit.

FIG. 4 shows an embodiment of a circuit 400 which may be coupled to the controller 202. The controller 202 may be configured to step-wise increase the first current to flow through the primary coil P1, P2 of the transformer 102. Circuit 400 may be used to provide the slowly increasing and decreasing current IP1, IP2 driving the primary coils P1, P2. It may have a plurality of subcircuits 402 connected in parallel. Each subcircuit 402 may comprise a series connection of a switch S and a resistor R. A first terminal 404 of each subcircuit 402 may be coupled to a reference potential Vs, GND and a second terminal 406 of each subcircuit 402 may be coupled to the transformer 102, for example one of its primary coils P1, P2. The node PG between the primary coils P1 and P2 may be connected to a reference voltage Vref. The reference voltage Vref may be about half of a supply voltage Vs.

A first plurality 408 of subcircuits 402 may have first terminals 404 connected to a first voltage, for example the supply voltage Vs, and second terminals 406 connected to the primary coil P1. The switches S in the first plurality 408 of subcircuits 402 may be controlled by signals g5 to g8 to provide a stepwise current IP1 in one direction in the primary coil P1. Current IP1 may decrease stepwise in magnitude.

A second plurality 412 of subcircuits 402 may have first terminals 404 connected to a second voltage, for example a ground voltage GND, and second terminals 406 connected to the primary coil P2. The switches S in the second plurality 412 of subcircuits 402 may also be controlled by signals g5 to g8 to provide a stepwise current IP2 in one direction in the primary coil P2. Current IP2 may decrease stepwise in magnitude.

A third plurality 410 of subcircuits 402 may have first terminals 404 connected to a first voltage, for example the supply voltage Vs, and second terminals 406 connected to the primary coil P2. The switches S in the third plurality 410 of subcircuits 402 may be controlled by signals g1 to g4 to provide a stepwise current IP2 in an opposite direction compared to the direction of the current IP2 provided by the second plurality 412 in the primary coil P2. Current IP2 may increase stepwise in magnitude.

A fourth plurality 414 of subcircuits 402 may have first terminals 404 connected to a second voltage, for example a ground voltage GND, and second terminals 406 connected to the primary coil P1. The switches S in the fourth plurality 414 of subcircuits 402 may also be controlled by signals g1 to g4 to provide a stepwise current IP1 in an opposite direction compared to the direction of the current IP1 provided by the first plurality 408 of the primary coil P1. Current IP21 may increase stepwise in magnitude.

For the sake of clarity, the pluralities 408, 410, 412, 414 of subcircuits 402 used for magnetizing and demagnetizing are shown with four subcircuits 402. However, any number, for example six to eight, of subcircuits 402 may be used. Some of the subcircuits 402, for example the subcircuits 402 controlled by signal g5, may have a resistor R with a zero resistance.

In principle, resistances R connected in series may also be used to provide increasing and decreasing currents. However, this may be disadvantageous with respect to the total chip area required for the switches and their parasitic capacitances.

Maximum symmetry when driving primary coils P1, P2 may be achieved by stepwise connecting and disconnecting resistors in parallel between the primary coils P1, P2 and the power supply Vs. Using resistors may have the advantage of always providing a symmetrical output resistance of the driver. A symmetrical output resistance may be difficult to achieve with graduated PMOS and NMOS transistors since the output resistance will only as symmetrical as the symmetry of the complementary produced transistors allows it to be. The switches may be arranged symmetrically.

FIG. 4 shows a circuit 400 for transmitting positive pulses of positive edges. The same circuit 400 may be needed for transmitting negative pulses. In this case, the connections to P1 and P2 may need to be swapped. The resistance R can be used in common, so that only the switches S may need to be provided again.

The resistance of at least some of the resistors R may be greater than the resistance of the primary coil. The resistance of at least some of the resistors R may be in the range from about 10 Ohm to about 1000 Ohm. The resistance of all resistors R may be the same. The resistance of the primary coil P1, P2 may be in the range from about 1 Ohm to about 50 Ohm.

Figure 5:
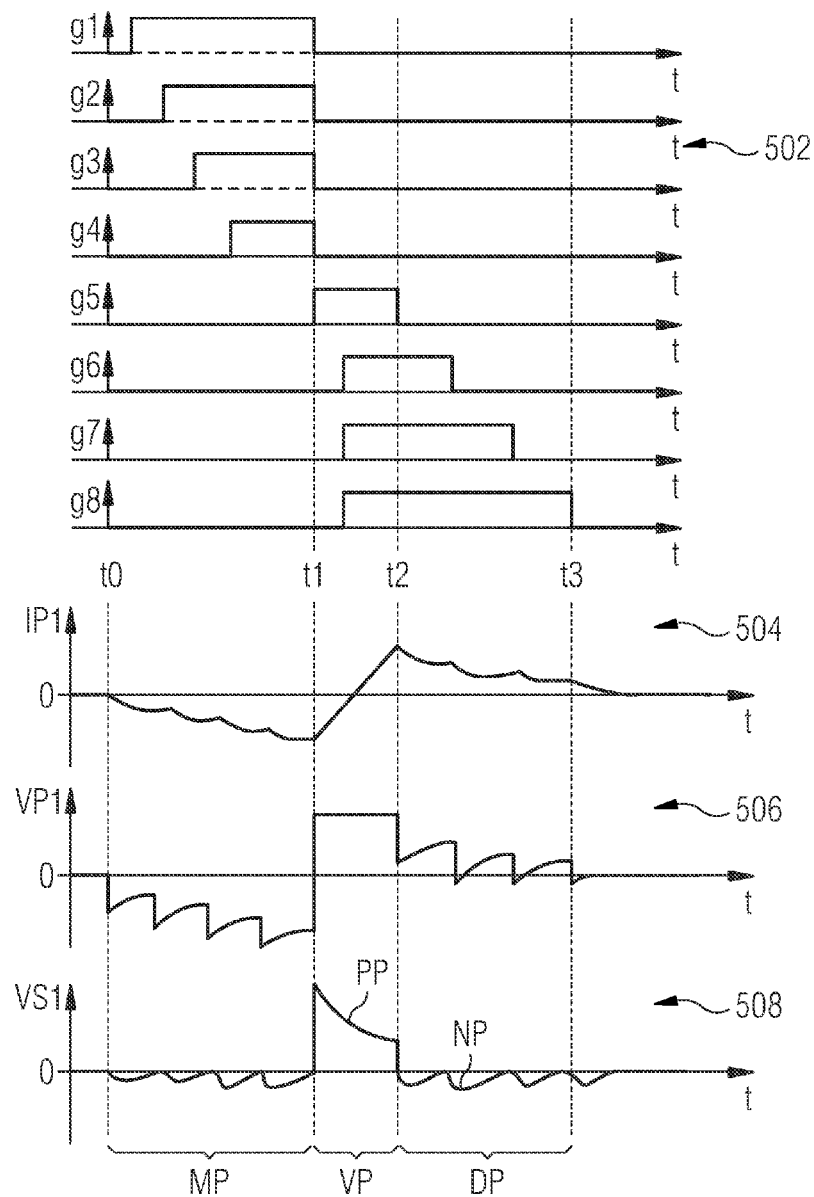
FIG. 5 shows examples of signal sequences of a transformer arrangement.

FIG. 5 shows examples of signal sequences 502 with signals g1 to g8 for controlling switches S, a signal sequence 504 of a current IP1 flowing through the primary coil P1, a signal sequence 506 of a voltage VP1 across the primary coil P1 and a signal sequence 508 of a voltage VS1 across the secondary coil S1. For the sake of clarity, FIG. 5 only shows signal sequences 504, 506 and 508 of current IP1 and voltages VP1, VS1 of the primary coil P1. The current IP2 flowing through the primary coil P2, the voltage VP2 across the primary coil P2 and voltage VS2 across the secondary coil S2 may be complimentary or inverted to the signal sequences shown.

All switches S may be open when no signal is to be transmitted. They may be open before the magnetization phase MP starts at time t0. The switches S controlled by signals g1 to g4 may be closed one after another in the magnetization phase MP. The current IP1 through the primary coils P1 may then increase in a stepwise manner since the resistors R are connected in parallel.

At the time t1, all of the switches S controlled by signals g1 to g4 may be opened and the switches S controlled by signal g5 may be closed at the same time. Between the times t1 and t2, which may be the voltage application phase VP or pulse phase, the switches S controlled by signals g6 to g8 may be closed, for example at the same time. The current IP1 through the primary coils P1 may then increase sharply in an opposite direction.

Between the time t2 to t3, which may be the demagnetization phase DP, the switches S controlled by signals g5 to g8 may be opened one after another, for example in that order, starting with the switches S controlled by signals g5. The current IP1 through the primary coils P1 may then decrease in a stepwise manner since the resistors R are disconnected one after another. After the demagnetization phase has been terminated all switches S may be open.

Evaluating the voltages VS1, VS2 at the secondary coils S1, S2 and reconstructing the clock signal T may be achieved by using comparators and a storage element, for example a RS flip-flop. As is shown in FIG. 5, transmitting a rising edge signal at a primary side coil P1 may result in a large positive pulse PP in the secondary side coil S1 which may be accompanied by a plurality of smaller negative pulses NP. Conversely, transmitting a negative edge signal at a primary side coil may result in a large negative pulse in the secondary side coil which may be accompanied by a plurality of smaller positive pulses. A comparator therefore should only capture the large pulse and should be insensitive towards the smaller pulses if they have an opposite polarity. The sensitivity of the comparator, or, in other words, the comparator threshold, should therefore lie between the amplitude of the large impulses and the amplitude of the smaller pulses. The sensitivity may be fixed or may have a temperature dependency that compensates the temperature dependency of the transmission path.

Oscillations during gaps between transmitting clock signals may be used for transmitting data in the reverse direction and may also be present in the signals at the secondary side coils and may be present at the input of the comparator. The amplitudes of these oscillations may be difficult to reproduce. They may depend on the quality Q of the resonating circuit formed by the transformer or by the pair of transformers. Embodiments therefore may have an automatic adjustment or adaption of the sensitivity of the comparator.

Figure 6:
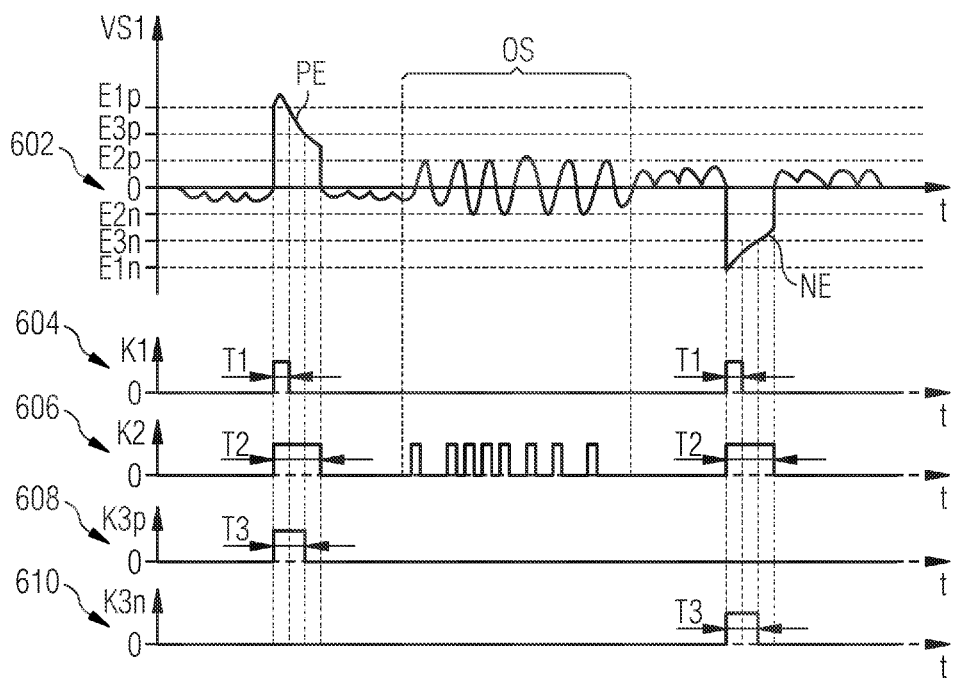
FIG. 6 shows examples of signal sequences of a transformer arrangement.

FIG. 6 shows examples of a signal sequence 602 of a secondary coil voltage VS1, a signal sequence 604 of an output K1 of a first comparator, a signal sequence 606 of an output K2 of a second comparator, a signal sequence 608 of a first output K3p of a third comparator and a signal sequence 610 of a second output K3n of the third comparator.

Signal sequence 602 shows a typical voltage waveform VS1 at a secondary coil S1 with a transmission of a positive edge of the clock signal PE, an oscillation OS for transmission in an opposite or reverse direction and a transmission of a negative edge of the clock signal NE. A receiving circuit 204 may use two window comparators with adjustable sensitivity or thresholds. The thresholds may be symmetric about zero. The comparator output may be inactive and may for example have a signal "0" when no input signal is applied to it. When the input signal exceeds the threshold of the comparator, the comparator output may be active and may for example output a signal "1".

The threshold of one of the window comparators may be adjusted, that is, it may be increased or decreased, until the duty cycle of active to inactive reached a predefined value, for example 2%. The steady state threshold is shown in signal sequence 602 of FIG. 6 as E1p for positive voltages and E1n for negative voltages. The output of the comparator is shown in signal sequence 604 as K1. The time during which signal VS1 is larger than E1p may be T1. The time during which signal VS1 is smaller than E1n may also be T1. The thresholds E1p, E1n may be near or close to the amplitudes of the large pulses. If some of the large pulses don't have the same amplitude, which may for example be the case when interfering signals are present, it may be possible that a large pulse doesn't appear in K1. However, this is not critical since only the average duty cycle over a plurality of pulses is relevant.

The threshold of the other window comparator may be adjusted, that is, it may be increased or decreased, until the duty cycle of active to inactive reaches another predefined value, for example 10%. The steady state threshold is shown in signal sequence 602 of FIG. 6 as E2p for positive voltages and E2n for negative voltages. The output of the comparator is shown in signal sequence 606 as K2. The time during which signal VS1 is larger than E2p may be T2. The time during which signal VS1 is smaller than E2n may also be T2. In case that the large pulses are shorter than 10% of the time between them, the steady state threshold may be such that some but usually not all of the pulses for transmission in the reverse direction may be present at the output K2 of the comparator.

Further, two comparators may be used that are not window comparators, that is, they will only detect signals in one direction. However, they may have the same dependency of a control signal for adjusting the sensitivity or threshold of the comparator as the windows comparators. One of the comparators may only detect signals that exceed its threshold E3p in a positive direction, the other comparator may only detect signals that exceed its threshold E3n in a negative direction. The sensitivities or thresholds E3 of the two comparators may be adjusted to the average value of the steady state thresholds E1 and E2. This may result in the highest transmission reliability in which all of the large pulses and none of the smaller pulses or oscillations are evaluated by the two transformers for clock signal recovery.

As an alternative, two identical comparators with swapped inputs may be used. Further, each of the window comparators may be implemented by two comparators with swapped inputs where the outputs of the two comparators are OR-ed. This may have the advantage that all of the comparators may the constructed in the same way and have very similar properties. A circuit arrangement using these alternatives is shown in FIG. 7.

Figure 7:
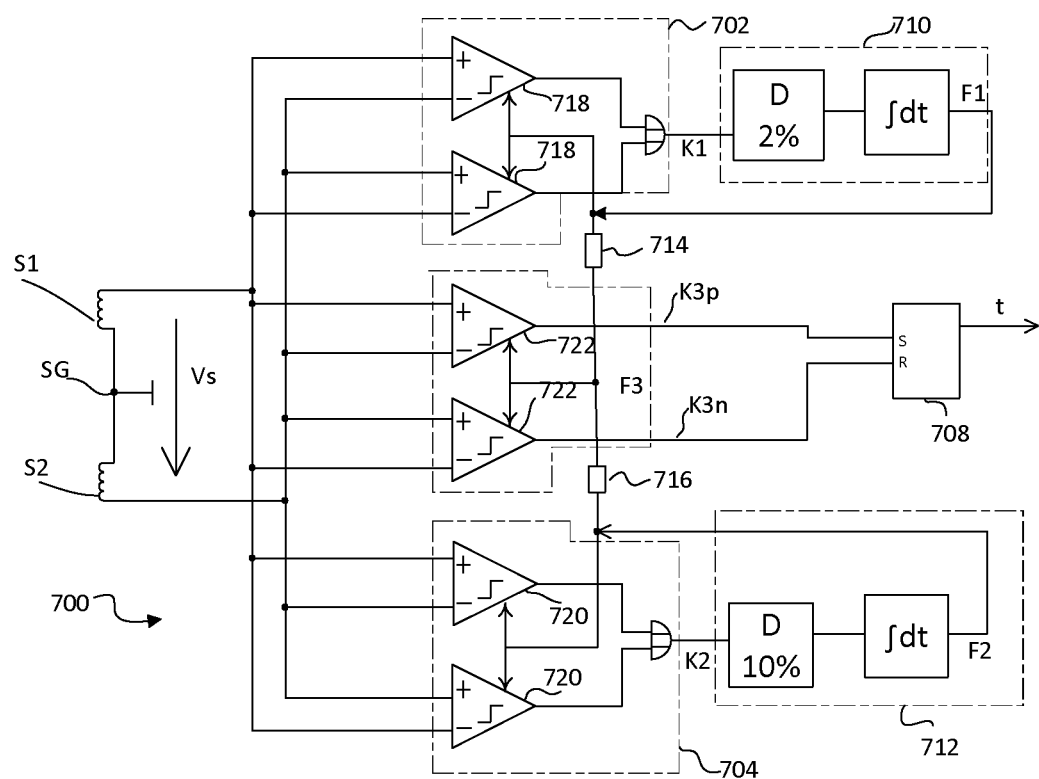
FIG. 7 shows an embodiment of a circuit arrangement.

FIG. 7 shows an embodiment of a circuit arrangement 700. The circuit arrangement 700 may be a receiving circuit 204 for pulses at the secondary coils S1, S2, shown and described in conjunction with FIG. 2. The circuit arrangement 700 may have at least three comparators 702, 706, 704 and a control circuit. The first comparator circuit 702, the second comparator circuit 704, and the third comparator circuit 706 may be coupled with the secondary coil S1, S2. The first comparator circuit 702, the second comparator circuit 704, and the third comparator circuit 706 may be all configured to receive the same signal, for example a voltage VS between the secondary coils S1, S2. The three comparators 702, 706, 704 may be constructed and designed in the same manner. The sensitivity or comparator threshold of each comparator 702, 706, 704 may be adjusted independently of the other comparators 702, 706, 704. The control circuit may have a first feedback control system 710, a second feedback control system 712 and coupling elements 714, 716.

The first comparator 702 may have a first feedback control system 710. The first feedback control system 710 may adjust the sensitivity or first comparator threshold E1p, E1n of the first comparator 702 depending on a duty cycle of a signal K1 at an output of the first comparator 702 in order to reach a first reference duty cycle. A feedback signal F1 output by the first feedback control system 710 may be connected to a threshold adjust input 718 of the first comparator 702. The first feedback control system 710 may for example have a capacitor that is charged when the output of the first comparator 702 is active and discharged when the output of the first comparator 702 is inactive. The discharging current may for example be 2% of the charging current. A voltage across the capacitor may represent or be the first comparator threshold. The capacitor may act as an integrating circuit and smooth the feedback signal F1. A remaining ripple in the feedback signal F1 is usually without consequence.

Similarly, the second comparator 704 may have a second feedback control system 712. The second feedback control system 712 may adjust the sensitivity or second comparator threshold E2p, E2n of the second comparator 704 depending on a duty cycle of a signal K2 at an output of the second comparator 704 in order to reach a second reference duty cycle. A feedback signal F2 output by the second feedback control system 712 may be connected to a threshold adjust input 720 of the second comparator 704. The second feedback control system 712 may for example have a capacitor that is charged when the output of the second comparator 704 is active and discharged when the output of the second comparator 704 is inactive. The discharging current may for example be 10% of the charging current. A voltage across the capacitor may represent or be the second comparator threshold. The capacitor may act as an integrating circuit and smooth the feedback signal F2. A remaining ripple in the feedback signal F2 is usually without consequence.

The sensitivity or third comparator threshold E3p, E3n of the third comparator 706 may be adjusted to lie between the sensitivities E1p, E1n, E2p, E2n of the first comparator 702 and the second comparator 704. A signal F3 may be connected to a threshold adjust input 722 of the third comparator 706. Signal F3 may be coupled to the feedback signal F1 via a coupling element 714 and may be coupled to the feedback signal F2 via a coupling element 716. The value of signal F3 may therefore lie between the value of feedback signal F1 and the value of feedback signal F2. The coupling elements 714, 716 may for example be resistors which may for example have the same resistance.

The control circuit may be configured to adapt the first comparator threshold E1p, E1n such that the first comparator circuit 702 is in a first comparator output state, for example a logic "1", for a first time portion T1 of a predefined time interval.

The control circuit may be further configured to adapt the second comparator threshold E2p, E2n such that the second comparator circuit 704 is in a first comparator output state, for example a logic "1", for a second time portion T2 of the predefined time interval, wherein the second time portion T2 is longer than the first time portion T1.

The control circuit may be configured to set the third comparator threshold E3p, E3n to be between the first comparator threshold E1p, E1n and the second comparator threshold E2p, E2n.

At least one of the first time portion T1 and the second time portion T2 may be the sum of a plurality of time sub-portions.

At least one of the first comparator circuit 702 and the second comparator circuit 704 may be configured as window comparator circuits. The third comparator circuit 706 may be configured to provide an evaluation output signal K3p, K3n.

A storage element 708 may be coupled to the output K3n, K3p of the third comparator circuit 706 to store the evaluation output signal. The storage element 708 may be a flip-flop, for example a RS flip-flop. A set input S may be connected to output K3p and a reset input R may be connected to output K3n. The output of the storage element 708 may be the clock signal t.

The control circuit 710, 712 may be configured to at least one of adapt the first threshold E1p, E1n based on the output signal K1 provided by the first comparator circuit 702, and adapt the second threshold E2p, E2n based on the output signal K2 provided by the second comparator circuit 704.

The control circuit 710, 712 may be configured to at least one of adapt the first threshold E1p, E1n based on a time-based evaluation of the output signal K1 provided by the first comparator circuit 702, and adapt the second threshold E2p, E2n based on a time-based evaluation of the output signal K2 provided by the second comparator circuit 704.

The control circuit 710, 712 may be configured to at least one of adapt the first threshold E1p, E1n based on the output signal K1 provided by the first comparator circuit, wherein a first signal state of the output signal K1 and a second signal state of the output signal K1 are weighted in a different manner, and adapt the second threshold E2p, E2n based on the output signal K2 provided by the second comparator circuit 704, wherein a first signal state of the output signal K2 and a second signal state of the output signal K2 are weighted in a different manner.

The control circuit 710, 712 may be configured to at least one of adapt the first threshold E1p, E1n based on an averaging of the output signal K1 provided by the first comparator circuit 702, and adapt the second threshold E2p, E2n based on an averaging of the output signal K2 provided by the second comparator circuit 704.

Figure 8:
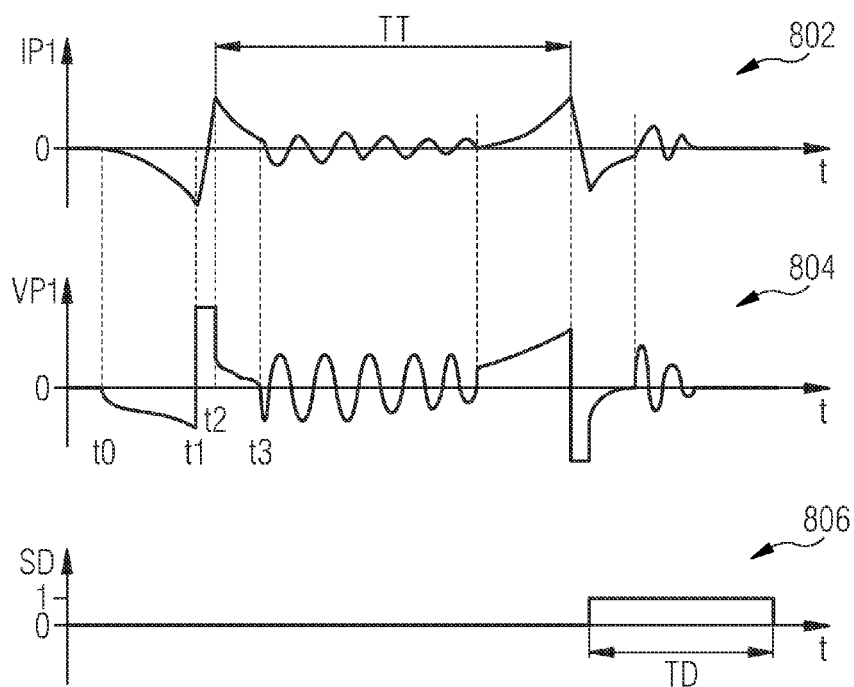
FIG. 8 shows examples of signal sequences of a transformer arrangement.

FIG. 8 shows examples of a signal sequence 802 of a current IP1 through a primary coil P1, a signal sequence 804 of a voltage VP1 across a primary coil P1 and a signal sequence 806 of a switch control signal SD over time t. The signal sequences 802, 804, 806 may occur during a data transmission across a transformer, for example, a coreless transformer, in which moments in time are transmitted by pulses in one direction. Every pulse may induce an oscillation in the transformer. Data may be transferred in the other direction by dampening or not dampening the induced oscillation.

Current IP1 may be modified with respect to the current IP1 shown in FIG. 3 and FIG. 5 in that it is also slowly reduced starting at time t2 but not until it reaches zero. Rather, it is suddenly interrupted at time t3 and jumps to zero which may induce or start an oscillation in the transformer or the pair of transformers. The frequency of oscillation may be the resonance frequency of the transformer or the pair of transformers. The frequency may be lowered if an oscillating circuit capacitor is used.

A common oscillating circuit capacitor may be useful when a pair of transformers is used. The oscillations at the primary coils P1, P2 may at first have opposite phases to each other. A common oscillating circuit capacitor may prevent a change in that phase relationship due to slightly different resonance frequencies of the transformer coils. The resonance circuit may then consist of the primary coils connected in series and the capacitor.

The damping of the oscillation may depend largely on the quality factor Q of the resonant circuit which may be influenced by the quality factor of the transformer. The quality factor of a transformer integrated on a semiconductor chip may be relatively low, for example in the range of 5 to 10. An excitation circuit, for example with a dynamic negative internal resistance, that compensates the losses in the transformer may be used to increase the time of post pulse oscillation. For example, an excitation circuit of a LC-oscillator may be used. The degree of excitation may be reduced with the amplitude of the oscillation in order to prevent an over-excitation. During over-excitation it may be difficult to separate the large pulses from the oscillations, as was discussed in conjunction with FIG. 6.

A switch 206 may be provided at the secondary side or high side HS, for example as is shown in FIG. 2. Switch 206 may be used to short-circuit the secondary coil or coils S1, S2. The quality factor on the primary side or low side LS may be much lower when switch 206 is closed compared to when switch 206 is open. If the excitation is not too large, the amplitudes of the oscillation will decrease very rapidly when switch 206 is closed.

A circuit on the high side HS for controlling the switch 206 may be configured, after receiving a pulse in clock signal direction, to close the switch 206 for a certain time period TD if a bit that is to be transmitted in data signal direction has a certain value, for example a "1" and may be configured to not close the switch 206 if the bit that is to be transmitted has another value, for example a "0". The time period TD may be shorter than the time period TT between two clock signal edges, so as to not disturb the reception of the next clock signal edge.

The LC-oscillator may not start oscillating immediately after switch 206 is opened since the oscillation has already decayed to a large extend and no excitation due to an abrupt ending of the demagnetization is available at this point in time. The LC-oscillator may only provide an exponentially increasing oscillating amplitude which however will start from a very small value if the oscillation has been damped strongly enough before.

In principle it is possible to keep switch 206 closed until the next edge of the clock signal has been received. A prerequisite for this may be that the switch has a current limiting behavior, that is, it has a strongly increasing on-resistance for larger currents flowing through it. Such a behavior may be achieved by driving field effect transistors with a gate voltage that is slightly above the threshold voltage. A voltage pulse on the secondary side may be damped by the closed current limiting switch when receiving the next clock signal edge. However, it will still have a sufficient value that can be detected if the current limiting is properly dimensioned. The detection circuit and method described in conjunction with FIG. 6 and FIG. 7 may be useful in this regard.

The detecting of data bits in data direction at the low side LS may for example be achieved by amplitude detection, for example by an amplitude detection circuit 210, for example as shown in FIG. 2. In case that the switch 206 on the high side HS is only closed for a certain time period, the amplitude of the oscillation may be detected at a point in time that may be delayed with respect to the transmission of the last edge of the clock signal by the same time period that the switch 206 on the high side HS is closed, but at the most directly before transmitting the next edge of the clock signal. In case that the switch 206 on the high side HS remains closed until the reception of the next edge of the clock signal, it is enough that the detection take place directly before transmitting the next clock signal edge, or to be more accurate, before the next magnetization phase.

As an alternative to the above, the number of oscillations or cycles that are detected by a comparator with a specified threshold may be counted. In case that a "1" is transmitted, only a few oscillations or cycles will be detected compared to the case that a "0" is transmitted, where significantly more oscillations or cycles may be detected. A digital evaluation circuit may evaluate the respective count values statistically and may adjust a threshold value below which the number of oscillations are interpreted as a "1" and above which the number of oscillations are interpreted as a "0".

Since a data bit may be transmitted between the transmission of two edges of the clock signal, it is possible to transmit two bits of data of a data stream during each clock signal period. For example, it is possible to transmit the data streams of two sigma delta modulators that are clocked using the clock signal. Alternatively and as an example, the data stream of one sigma delta modulator and additional redundancy information may be transmitted. If more than two bits are to be transmitted during a clock signal period, it is possible to repeat the transmission of each clock signal edge after a quarter of the clock period and to transmit another bit in the data stream direction thereafter.

A transformer arrangement for signal transmission may have at least one transformer, a controller and a switching circuit. The transformer may have a primary coil and a secondary coil. The transformer arrangement may have a resonance frequency. The controller may be configured to terminate driving the primary coil so that the transformer arrangement is oscillating in the resonance frequency. The switching circuit may be coupled to the secondary coil and configured to, in a first switching state, let the transformer arrangement oscillate, and, in a second switching state, to decrease the oscillation of the transformer arrangement. Driving the primary coil may be at least one of a magnetization phase; a demagnetization phase; and a voltage application phase. The primary coil may be driven after a certain time period has passed after terminating driving the primary coil. The transformer arrangement may further have an amplitude detection circuit which may be coupled to the primary coil. The certain time period may be chosen to be long enough to decrease the oscillation if the switching circuit is in a second switching state and long enough that the decrease in oscillation can be detected in the amplitude detection circuit. The time period during which the switching circuit is in the second switching state may be shorter than the certain time before starting to drive the coil. The direction of magnetization of consecutive driving the primary coil phases may have opposite polarities. The direction of magnetization of consecutive driving the primary coil phases may have the same polarity for a certain number of consecutive driving the primary coil phases. During the certain time before starting to drive the coil, a bit may be transmitted by detecting if the oscillation has decreased or not.

The circuit arrangement 400 described in conjunction with FIG. 4 for magnetizing and demagnetizing the transformer or the pair of transformers requires the provision of closely spaced consecutive points in time in order to sequentially add or remove the resistances. The time intervals between these points may be significantly shorter than the L/R time constant of the primary coil(s). The L/R time constant of a transformer integrated on a semiconductor chip may be in the range of 5 ns. Therefore, points in time with time intervals between them of 1 ns to 2 ns may need to be provided.

The symmetry of the peak currents in the primary coil at times t1 and t2 may depend largely on maintaining the time intervals between t0 to t1 and between t1 to t2. Further, the amplitude of the post pulse oscillation after the abrupt ending of the demagnetization phase DP may depend on maintaining the time intervals between t2 to t3. The generation of digital signals following each other in short time intervals may be achieved by using a chain of inverters. However, a chain of inverters may be not accurate enough since the delay through the inverters may depend significantly on processing parameters, supply voltage and temperature. Another method for generating signals following each other with intervals in the range of nanoseconds may be using a digital PWM (pulse width modulator) modulator. Here, the period of a clock signal may be divided into equal time intervals by using a feedback control circuit and adjustable delay elements. Such a circuit may require adjusting the number of delay elements depending on the frequency of the clock signal, which may require considerable effort during chip design and when using the transmission channel in a higher-level system. A simple and autonomous circuit arrangement is presented for generating sequential signals using relatively accurate and reproducible time intervals.

The circuit arrangement is based on the insight that the total delay between an input signal and an output signal is irrelevant, rather it is the time interval between the output signals that is significant. Delay circuits with different delay times may be used. An input signal may be simultaneously applied to the inputs of the delay circuits which may result in signals at the outputs of the delay circuits which may be staggered with respect to each other. The delay elements are constructed so that at least one processing parameter has the greatest effect on the delay elements with the shortest delay and a staggered lesser effect on delay elements with longer delays. Processing parameters which may be designed to have an influence on the circuit are for example the width or lateral dimension of resistances and capacitors. The size of the capacitor may grow with the desired delay. A capacitor with a bigger delay time may be less dependent on structure width variations, if the capacitor is not constructed using units capacitors.

The delay element with the shortest delay may have resistances with a small width. The resistances in delay elements with longer delay may have a larger width. The width of the resistance may be proportional to the delay time. For a given resistance, resistances with a larger width may need to be longer. In the end, the achievable ratio between the longest and shortest time delay may be a question of chip space.

The delay circuits may use out-of-phase or anti-phase signals in a delay element. As a result, the dependency on the threshold voltages of the inverters may be reduced. The delay circuits may be constructed in a symmetric manner They may process both a signal and a complementary signal. As a result, coding the required control signals for the switches may be simplified since a complementary signal is present for every signal and the number of gates in each signal path is constant.

Figure 9:
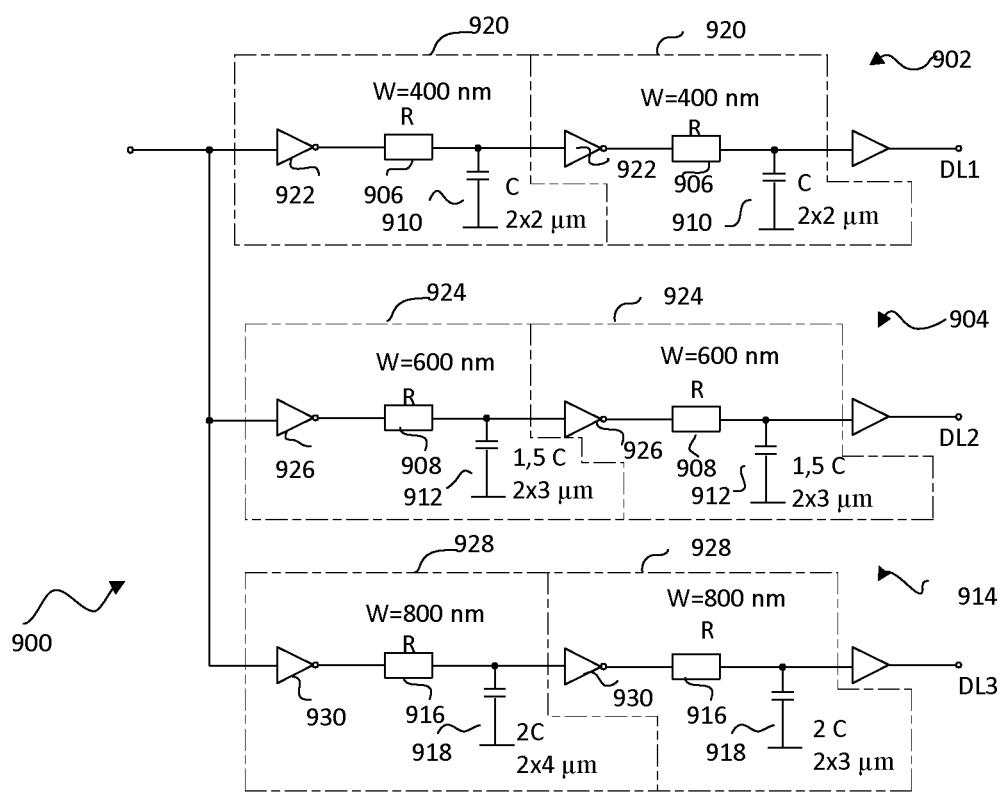
FIG. 9 shows an embodiment of a circuit arrangement.

FIG. 9 shows an embodiment of a circuit arrangement 900. The circuit arrangement 900 may have three delay circuits 902, 904, 914. Each delay circuit 902, 904, 914 may have two delay stages 920, 924, 928. The two delay stages 920, 924, 928 may be operated in an anti-phase manner. Delay stage 920 may use a resistance 906 with a resistance R and a capacitor 910 with a capacitance C. The width of the resistance 906 may for example be 400 nm. The capacitor 910 may for example be 2×2 µm. Delay stage 924 may use a resistance 908 with a resistance R and a capacitor 912 with a capacitance 1.5 C. The width of the resistance 908 may for example be 600 nm. The capacitor 912 may for example be 2×3 µm. Delay stage 928 may use a resistance 916 with a resistance R and a capacitor 918 with a capacitance 2 C. The width of the resistance 916 may for example be 800 nm. The capacitor 918 may for example be 2×4 µm.

The signal DL2 at an output of delay circuit 904 may be delayed by RC with respect to the signal DL1 at an output of delay circuit 902. The signal DL3 at an output of delay circuit 914 may be delayed by another RC. R may be the resistance that is chosen by design multiplied by the variations of the film resistance but without the influence of variations in structural width or lateral dimension. Capacitors 910, 912, 918 may be manufactured as MOS-capacitors with a very tight tolerances. The non-linearity usually associated with MOS capacitors may be compensated by the series connection of the anti-phase operated delay stages 920, 924, 928, so that the symmetry of the delay time for rising and falling edges is not affected.

The propagation delay and delay time of wiring used are the same for all delay circuits and doesn't influence the time difference between the output signals DL1, DL2, DL3.

The circuit arrangement 900 may be a pulse generating circuit arrangement configured to provide a pulse. It may generate two signals or pulses out of a common input signal. A first signal of the two signals may have a shorter time delay from the common input signal than a time delay of a second signal from the common input signal. The time delay of the first signal may have a greater sensitivity towards a production parameter than the time delay of the second signal.

It may have a first signal delay circuit 902 and a second signal delay circuit 904. The first signal delay circuit 902 and the second signal delay circuit 904 are configured to receive the same signal S to be delayed. The second signal delay circuit 904 may have a longer signal delay time than the first signal delay circuit 902. The circuit arrangement 900 may used in be a pulse generating circuit arrangement configured to provide a pulse. The pulse generating circuit may be configured to provide the pulse such that the pulse is started by a signal provided by the first signal delay circuit and such that the pulse is terminated by a signal provided by the second signal delay circuit.

The first signal delay circuit 902 may have a first component being subject to a process variation. The first component may have an effect on the signal delay time of the first signal delay circuit 902.

The second signal delay circuit 904 may have a second component being subject to the same process variation as the first component. The second component may have an effect on the signal delay time of the second signal delay circuit.

The degree of influence of the process variation of the second component to the signal delay time of the second signal delay circuit 904 may be smaller than the degree of influence of the process variation of the first component to the signal delay time of the first signal delay circuit 902.

The degree of influence of the process variation of the first component on the signal delay time of the first signal delay circuit may be inversely proportional to the effect of the first component on the signal delay time of the first signal delay circuit. The degree of influence of the process variation of the second component on the signal delay time of the second signal delay circuit may be inversely proportional to the effect of the second component on the signal delay time of the second signal delay circuit.

Therefore, the degree of influence of the process variation on signal delay times of the first component and the second component may be the same in absolute terms, for example in nanoseconds. As a consequence, the difference between the first signal delay and the second signal delay may be independent of the process variations, that is, the degree of influence of the process variations is diminishing.

The first component may have a first resistor 906. The second component may have a second resistor 908. The first resistor 906 and the second resistor 908 may have different resistor widths. The first resistor 906 and the second resistor 908 may have the same nominal resistance value R.

The first signal delay circuit 902 may further have a first capacitor 910 having a first capacitance C. The second signal delay circuit 904 may further have a second capacitor 912 having a second capacitance. The second capacitance may be different from the first capacitance. The second capacitance may be higher than the first capacitance. For example, the first capacitance may be C and the second capacitance may be 1.5 C.

The circuit arrangement 900 may further have a third signal delay circuit 914 comprising a third component being subject to the same process variation as the first component 906. The third component may have an effect on the signal delay time of the third signal delay circuit 914. The degree of influence of the process variation of the third component to the signal delay time of the third signal delay circuit 914 is smaller than the degree of influence of the process variation of the second component to the signal delay time of the second signal delay circuit 904.

The first signal delay circuit 902 may have a series connection of a plurality of sub delay circuits 920. Each sub delay circuit 920 may have a first component 906 and a signal inverter 922. The second signal delay circuit 904 may have a series connection of a plurality of sub delay circuits 924. Each sub delay circuit 924 may have a second component 908 and a signal inverter 926.

As is described above and shown for example in FIG. 8, pulses with opposite polarities may be alternately transmitted across the coreless transformer in clock signal direction. The alternation of the pulses may contain a high amount of redundancy. Some of the redundancy may be giving up in order to transmit additional data in clock signal direction.

The additional data may for example be configuration information, which may for example be used to change or calibrate the gain of a sigma delta modulator. As another example, a successive approximation analog to digital converter may be used instead of a sigma delta modulator where its conversion may be started by the transmission of additional information in addition to the clock signal. Further, the additional data may transmit trimming or configuration information, which may for example be stored on the low side LS, for circuit elements on the high side HS, for example in case that the high side HS doesn't have a non-volatile memory. The trimming or configuration information may for example be used to calibrate a bandgap reference or a zero point error of an analog-to-digital converter located on the high side HS.

The additional data may be transmitted in clock signal direction by inverting individual pulses. For example, a negative pulse may be replaced by a positive pulse or a positive pulse may be replaced by a negative pulse in an alternating series of positive and negative pulses. In order that the integrity of the received pulses can still be checked, only a small portion of the total number of transmitted pulses should be inverted. For example, every eighth or sixteenth pulse may be inverted.

A receiving circuit using a RS flip-flop as a memory, such as is shown in FIG. 7, would simply ignore successive pulses of the same polarity. The receiving circuit may need to compare the polarity of the received pulse with the state of the memory cell and change the memory cell in case of a deviation from the alternating pulse series. It may output an additional pulse for a decoding logic for the additional data. A synchronization of the memory cell with the received pulses may be necessary in case that the polarity of several successive received pulses is in contradiction to the polarity expected due to the state of memory cell.

Figure 10:
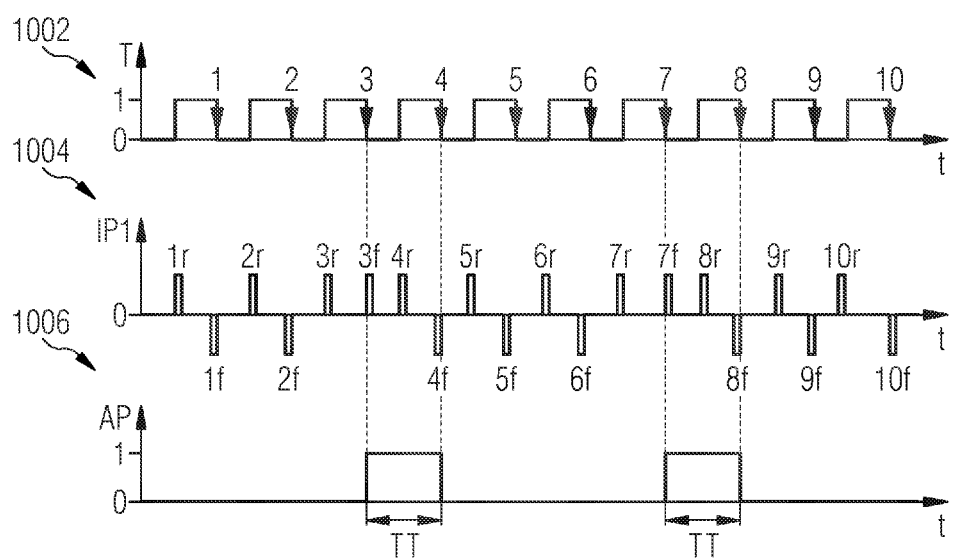
FIG. 10 shows examples of signal sequences of a transformer arrangement.

FIG. 10 shows examples of a signal sequence 1002 of a clock signal, a signal sequence 1004 for the transmission of the clock signal and a signal sequence 1006 of additional data. For the sake of simplicity, rectangular pulses without magnetizing and demagnetizing are shown. A rising edge in signal sequence 1002 may give a positive pulse in signal sequence 1004 which is indicated by the appendix "r". A falling edge in signal sequence 1002 may give a negative pulse in signal sequence 1004 which is indicated by the appendix "f". Positive and negative edges of the clock signal may be transmitted by pulses with opposite polarity. If no additional data is to be transmitted, signal sequence 1002 may be a sequence of pulses with alternating polarity.

As an example, instead of a negative pulse, a positive pulses may be transmitted at the falling edges of the third and seventh clock pulse. The polarities of pulses 3f, 7f have been changed from negative to positive. The receiving circuit may detect that the polarity of the received clock pulse (positive) does not match the expected polarity (negative). It may generate a "1" at its output which may for example last for one clock signal period TT, which is shown in signal sequence 1006. Signal sequence 1006 may be used to transmit data in the clock signal direction.

If an inversion of pulses is to take place every N pulses, the receiving circuit may be configured to output a "1" for N pulses. For example, if one wants to invert at most the eighth pulse, the receiving circuit may output a "1" for the duration of eight pulses or four clock periods. In this manner, many "1" s and "0" s may be transmitted in the additional channel. Data may be transmitted in the same direction as the clock signal over the same interface by inverting the polarity of a few of pulses depending on the data that is to be transmitted.

Figure 11:
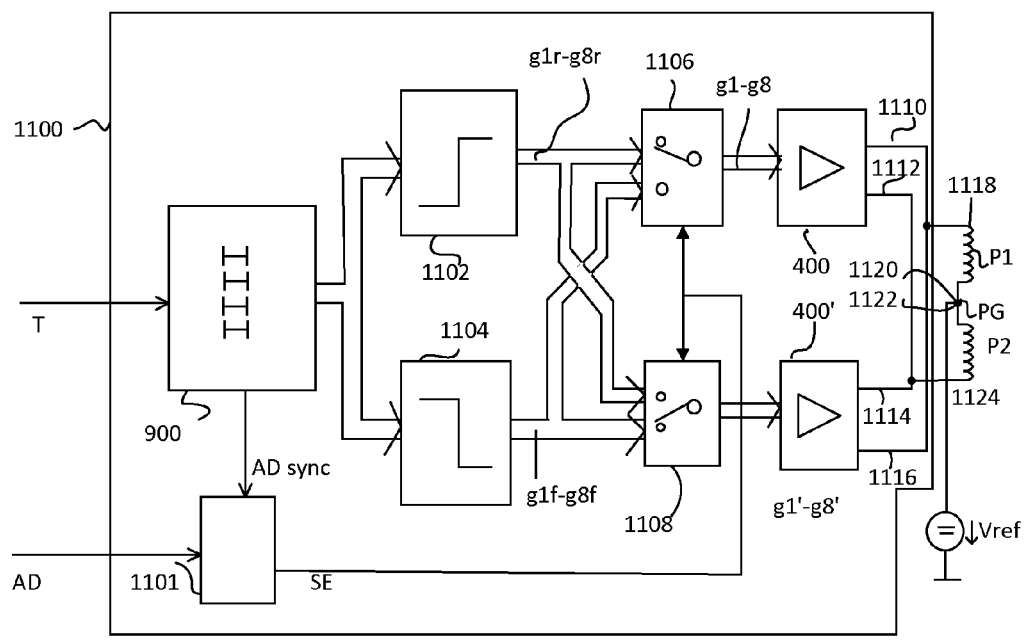
FIG. 11 shows an embodiment of a circuit for encoding data and clock signals.

FIG. 11 shows a circuit 1100 for transmitting data and clock signals, for example, across the transformer 102. The term "additional data" may be used for data transmitted in the same direction, for example across a transformer 102, as the clock signal T. It may be data that is transmitted from the primary side (or low side) to the secondary side (or high side). This is in contrast to data transmitted in a direction opposite to the direction of the clock signal T, that is data that is transmitted from the secondary side (or high side) to primary side (or low side), for example d1, d2. Data may therefore be transmitted in both directions across the transformer 102, even though the clock signal T is only transmitted in one direction.

The circuit 1100 may be similar to the circuit 202 shown and described in conjunction with FIG. 2, including an input for a clock signal T. Further it may have an input for the additional data signal AD to be transmitted in the same direction that the clock signal T is transmitted in. The circuit 1100 may have an output coupled to a primary coil of a transformer 102. The primary coil may for example be a single coil or primary coils P1, P2 coupled in series with each other. A first terminal 1118 of the primary coil P1 may provide a first connection point of the primary coil, a second terminal 1124 of the primary coil P2 may provide a second connection point of the primary coil. A second terminal 1120 of the primary coil P1 may be coupled to a first terminal 1122 of the primary coil P2 to form a node PG between the primary coils P1, P2. Node PG may be connected to a reference voltage.

The circuit 1100 may have a delay circuit 900, an encoder 1101, a rising edge logic 1102, a falling edge logic 1104, a first multiplexer circuit 1106, a second multiplexer circuit 1108, a first driver circuit 400, and a second driver circuit 400'.

The clock signal T may be applied to the delay circuit 900. The delay circuit 900 may provide a plurality of signals with different delays to the clock signal T. The delays of the signals relative to each other may increase by a constant delay from one to another signal. The delay circuit 900 may, for example, be implemented in the same way as circuit arrangement 900 described in conjunction with FIG. 9. The delays may be activated by a rising edge or a falling edge of the clock signal T. Thus, delayed signals for rising edges and falling edges of the clock signal T may be provided.

The plurality of signals with different delays may be coupled to the rising edge logic 1102 and to the falling edge logic 1104 as an input. The rising edge logic 1102 may generate signals g1r to g8r for every rising edge. The signals g1r to g8r may, for example, be like the signals g1 to g8 shown and described in conjunction with FIG. 5. However, the rising edge logic 1102 does not generate signals for falling edges. The falling edge logic 1104 may generate signals g1f to g8f for every falling edge. The signals g1f to g8f may, for example, be like the signals g1 to g8 shown and described in conjunction with FIG. 5. However, the falling edge logic 1102 does not generate signals for rising edges.

The rising edge logic 1102 and the falling edge logic 1104 may be implemented as circuit which are complementary to each other, that is, they may have components and potentials of opposite polarity. In another embodiment, they may be implemented the same way, however, with one of the rising edge logic 1102 and the falling edge logic 1104 inverting the plurality of signals with different delays at its input.

Depending on a signal SE provided by the encoder 1101, the first multiplexer 1106 may transmit signals g1r to g8r or signals g1f to g8f to the first driver 400 as signals g1 to g8. Similarly, depending on a signal SE provided by the encoder 1101, the second multiplexer 1108 may transmit signals g1f to g8f or signals g1r to g8r to the second driver 400' as signals g1' to g8'.

The first driver circuit 400 and the second driver circuit 400' may be implemented as shown and described in conjunction with FIG. 4. They may share a common set of resistors, as described above. A first output 1110 of the first driver circuit 400 and a second output 1116 of the second driver circuit 400' may be coupled to the first connection point 1118 of the primary coil. A second output 1112 of the first driver circuit 400 and a first output 1114 of the second driver circuit 400' may be coupled to the second connection point 1124 of the primary coil.

The additional data AD may need to be synchronized with the clock signal T, so that it does not disturb the signals generated by the clock signal T, for example the signals shown in FIG. 5 for the non-inverted case. A signal ADsync, for example a delayed clock signal with a delay, that is at least as long as the delay of the signal with the longest delay provided by the delay circuit 900, may be used for synchronization. The synchronization may take place in the encoder 1101.

In case that no additional data AD is to be transferred, signal SE may have a first value controlling the first multiplexer circuit 1106 and the second multiplexer circuit 1108. Signals g1r to g8r may be transmitted through the first multiplexer 1106 to the first driver 400 as signals g1 to g8. Signals g1f to g8f may be transmitted through the second multiplexer 1108 to the second driver 400' as signals g1' to g8'.

At every rising edge of the clock signal T, the first driver circuit 400 may provide the primary coils P1, P2 with signals 504 and 506 as shown and described in conjunction with FIG. 5. At every falling edge of the clock signal T, the second driver circuit 400' provides the primary coils P1, P2 with signals which are inverted to the signals 504 and 506 shown and described in conjunction with FIG. 5. In other words, adjacent pulses transferred across the transformer 102 may alternate in polarity when no additional data AD is transferred.

In case that additional data AD is to be transferred, the encoder may provide signal SE with a second value to control the first multiplexer 1106 and the second multiplexer 1108 so that signals g1f to g8f may be used as input for the first multiplexer 1106 and signals g1r to g8r may be used as input for the second multiplexer 1108 when data is to be transmitted. In other words, a falling edge of the clock signal T may lead to an output at the first driver 400, and a rising edge of the clock signal T may lead to an output at the second driver 400.

The encoder 1101 may encode the additional data AD in various manners. As a first example, after a rising edge of the additional data signal AD has occurred, exactly one rising edge of the clock signal T may be inverted in polarity at the primary coil by passing signals g1r to g8r through the second multiplexer circuit 1108. After a falling edge of the additional data signal AD has occurred, exactly one falling edge of the clock signal T may be inverted in polarity at the primary coil by passing signals g1f to g8f through the first multiplexer circuit 1106. The encoder 1101 may output a corresponding signal SE to control the first multiplexer circuit 1106 and the second multiplexer circuit 1108 depending on the additional data AD.

As a second example, if a first value, for example a "zero", is applied as additional data AD at the encoder 1101, the polarities of the pulses corresponding to the rising and falling edges of the clock signal T are not inverted. If a second value, for example a "one", is applied as additional data AD at the encoder 1101, the polarity of every N-th pulse may be inverted. "N" may be an integer. The integer may be greater than two, that is, N>2. In this case, there is sufficient time for adjacent pulses to alternate in their polarity, so that the transmission of the clock signal T can be detected. For example, "N" could be N=8.

Figure 12:
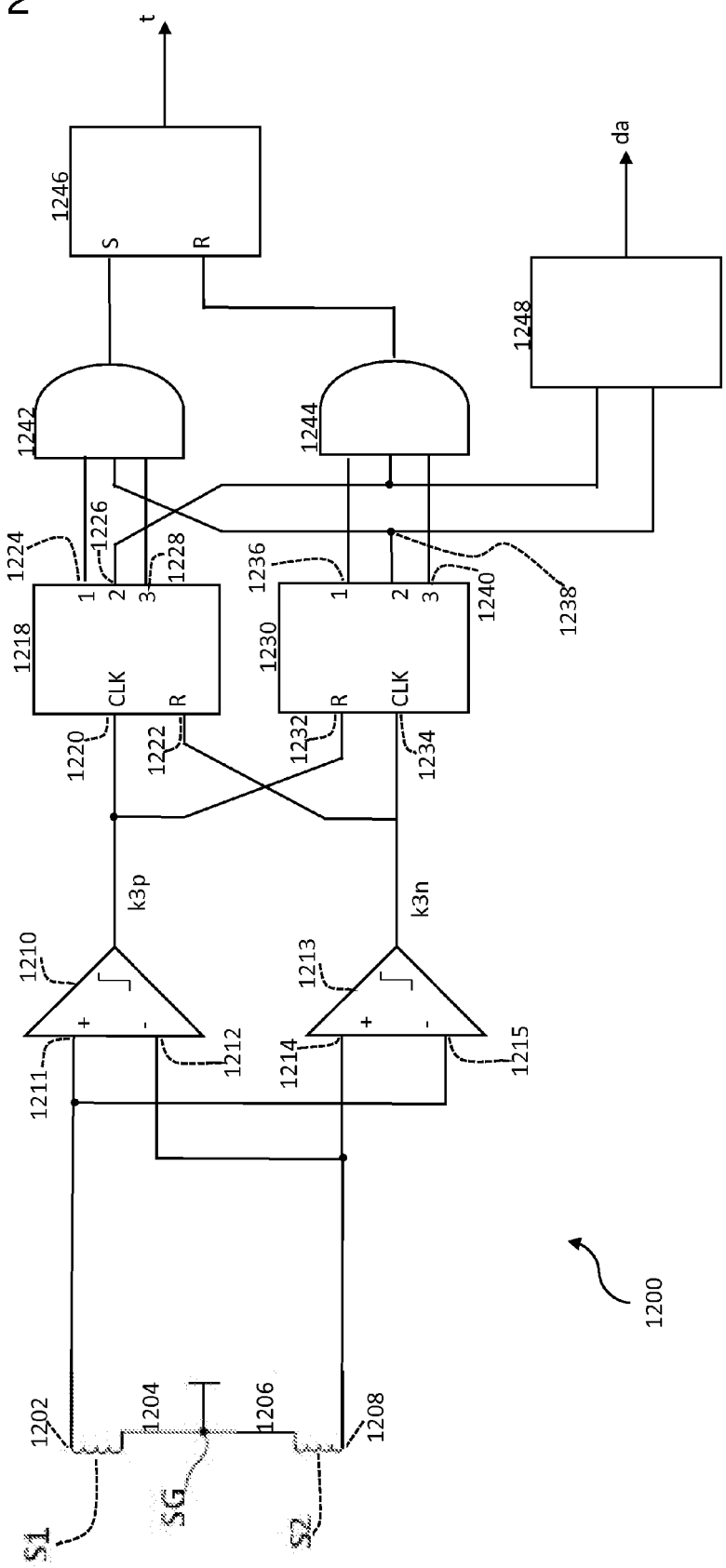
FIG. 12 shows an embodiment of a circuit for decoding clock and additional data signals.

FIG. 12 shows an embodiment 1200 of a circuit for decoding clock and additional data signals, which may for example be transmitted across a transformer 102. The circuit 1200 may have an input coupled to a secondary coil of the transformer 102. The secondary coil may for example be a single coil or two secondary coils S1, S2 coupled in series with each other. A first terminal 1202 of the secondary coil S1 may provide a first connection point of the secondary coil, a second terminal 1208 of the secondary coil S2 may provide a second connection point of the secondary coil. A second terminal 1204 of the secondary coil S1 may be coupled to a first terminal 1206 of the secondary coil S2 to form a node SG between the secondary coils S1, S2. Node SG may be connected to a reference potential, for example a ground potential. The circuit 1200 may correspond to the receiving circuit shown in FIG. 2 with an output for the clock signal t and an additional output for an additional data signal ad.

The circuit 1200 may have a first comparator 1210, a second comparator 1213, a first counter 1218, a second counter 1230, a first OR-gate 1242, a second OR-gate 1244, a storage element, for example a flip-flop, 1246, and a decoder 1248. The storage element may output the transmitted clock signal t. The decoder 1248 may output the additional data signal ad.

The first connection point 1202 of the secondary coil is coupled to a positive input 1211 of the first comparator 1210 and to a negative input 1215 of the second comparator 1213. The second connection point 1208 of the secondary coil is coupled to a negative input 1212 of the first comparator 1210 and to a positive input 1214 of the second comparator 1213. The first comparator 1210 and the second comparator 1213 may correspond to the comparator 706 shown and described in conjunction with FIG. 7.

The output K3$p$ of the first comparator 1210 may be coupled to a clock input 1220 of the first counter 1218 and to a reset input 1232 of the second counter 1230. The output K3$n$ of the second comparator 1213 may be coupled to a reset input 1222 of the first counter 1218 and to a clock input 1234 of the second counter 1230.

The first counter 1218 and the second counter 1230 may each have a first output 1224, 1236, a second output 1226, 1238, and a third output 1228, 1240. The counters 1218, 1230 may be configured as follows: A first pulse at the clock input 1220, 1234 may produce a pulse at the first output 1224, 1236. A second pulse at the clock input 1220, 1234 may produce a pulse at the second output 1226, 1238. A third pulse and further pulses at the clock input 1220, 1234 may produce corresponding pulses at the third output 1228, 1240.

The first OR-gate 1242 has three inputs, coupled to the first output 1224 and the third output 1228 of the first counter 1218 and to the second output 1238 of the second counter 1230, respectively. The second OR-gate 1244 has three inputs coupled, to the first output 1236 and the third output 1240 of the second counter 1230 and to the second output 1226 of the first counter 1230, respectively.

The output of the first OR-gate 1242 may be coupled to a set input S of the flip-flop 1246. The output of the second OR-gate 1244 may be coupled to a reset input R of the flip-flop 1246. The flip-flop 1246 may have an output, at which a clock signal t may be provided. The clock signal t may correspond to the transmitted clock signal T on the primary side of the transformer 102 in FIG. 11. The flip-flop 1246 may, for example, be the storage element 708 shown and described in conjunction with FIG. 7.

The decoder 1248 may have two inputs. One of the inputs may be coupled to the second output 1226 of the first counter 1218, the other input may be coupled to the second output 1238 of the second counter 1230.

In the case that no additional data AD is transmitted, the transformer 102 may transmit adjacent pulses with opposite polarity, see also description of FIG. 11. A pulse with a positive polarity may be detected as an output of the first comparator 1210. The output K3$p$ may cause the first counter 1218 to output a pulse at its first output 1224 and may reset the second counter 1230. A pulse with a negative polarity may be detected as an output K3$n$ of the second comparator 1213. The output K3$n$ may cause the second counter 1230 to output a pulse at its first output 1236 and may reset the first counter 1218. In other words, when no additional data is transmitted, pulses are alternately output at the first outputs 1224, 1236 of the counters 1218, 1230. The flip-flop 1246 may toggle at every transmitted pulse. In other words, the counters 1218, 1230 and the OR-gates 1242, 1244 may be regarded as transparent and circuit 1200 may act like the circuit shown and described in conjunction with FIG. 7.

In the case that additional data AD is transmitted, two pulses with the same polarity may be transmitted one after another across the transformer 102. In this case, one of the counters 1218, 1230 will continue to count as it is not reset by a pulse of the opposite polarity. In case of a correct additional data transmission, where the polarity of one pulse is inverted, a third pulse with the same polarity may follow the previous two pulses. After the third pulse, a pulse of opposite polarity may follow, which may reset the corresponding counter. Therefore, the first and the second counter 1218, 1230 usually do not count to more than three. The flip-flop 1246 may continue to toggle at every transmitted pulse as the second pulse is connected via one of the OR-gates 1244, 1242 to one input R, S of the flip-flop 1246 and the first and second pulse are connected via the other OR-gate 1242, 1244 to the other input S, R of the flip-flop 1246.

The flip-flop 1246 may toggle at every transmitted pulse independent of the transmission of additional data AD so that the clock signal t may always be derived if only a few single pulses are inverted. Further, the flip-flop 1246 will not remain in the wrong state forever if it has lost count, for example, if the polarity of more than one pulse has been inverted.

Decoding the transmitted additional data may depend on the way in which the additional data AD was encoded. If it is encoded according to the first example described in conjunction with FIG. 11, where after a rising edge of the additional data signal AD exactly one rising edge of the clock signal T is inverted in polarity and after a falling edge of the additional data signal AD has occurred, exactly one falling edge of the clock signal T is inverted in polarity, the second outputs 1226, 1238 of the counters 1218, 1230 may be directly connected to the two inputs R, S of a second flip-flop. The additional data ad may then be accessible at the output of the second flip-flop. In this case, the encoder 1248 may include the second flip-flop (or storage element).

In the second example, wherein the polarity of every N-th pulse may be inverted to transmit a "one", the second counter outputs 1226, 1238 may be OR-ed and then applied to a clock input of an additional counter. The encoder 1248 may include the additional counter. The additional counter may provide a one ("1") at its output if a pulse is applied to its set input. The additional counter may then count the pulses at the first outputs 1224, 1236 of the counters 1218, 1230. Since the pulses at second and third counter output 1226, 1228 and 1238, 1240 are not counted, the additional counter may be reset once a count of N−2 has been reached. If further pulses are provided at the second counter outputs 1226, 1238, the additional counter does not need to be reset.

In another embodiment, the additional counter may count the decoded pulses at the clock output t and may reset the counter after N/2 counts.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Alternately and/or additionally, the scope of the disclosure is specifically intended to include without limitation at least the embodiments described in the enumerated clauses below. Equivalents thereof are also explicitly embraced.

1. A transformer arrangement for signal transmission, the transformer arrangement comprising:
   at least one transformer comprising a primary coil and a secondary coil; and
   a controller configured to
      in a magnetization phase, control a first current to flow through the primary coil to increase until a predefined criterion is fulfilled, wherein the magnetization phase is longer than one of:
         a time constant of the primary coil of the at least one transformer; and
         two times the time constant of the primary coil of the at least one transformer;
      in a voltage application phase, apply a voltage to the at least one transformer so that a second current flows through the primary coil, wherein the second current has a polarity which changes during the voltage application phase compared with the first current, wherein the voltage application phase is shorter than one of:
         two times the time constant of the primary coil of the at least one transformer; and
         the time constant of the primary coil of the at least one transformer.
2. The transformer arrangement of clause 1,
   wherein the controller is further configured to, in a demagnetization phase, control a third current to flow through the primary coil to decrease, wherein the demagnetization phase is longer than one of:
      the time constant of the primary coil of the at least one transformer; and
      two times the time constant of the primary coil of the at least one transformer.
3. The transformer arrangement of clause 1 or 2,
   wherein the controller is configured to step-wise increase the first current to flow through the primary coil of the at least one transformer.
4. The transformer arrangement of one of clauses 1 to 3,
   wherein the at least one transformer is a coreless transformer.
5. The transformer arrangement of one of clauses 1 to 4,
   further comprising:
   a circuit coupled to the controller, the circuit comprising a plurality of subcircuits connected in parallel;
   wherein each subcircuit comprises a series connection of a switch and a resistor; wherein a first terminal of each subcircuit is coupled to a reference potential and a second terminal of each subcircuit is coupled to the at least one transformer.
6. The transformer arrangement of clause 5,
   wherein the controller is configured to open all switches before the magnetization phase starts.
7. The transformer arrangement of clause 5 or 6,
   wherein the controller is configured to close a first group of switches one after another to stepwise increase the current in the magnetization phase.
8. The transformer arrangement of clause 7,
   wherein the controller is configured to open the first group of switches and to close a second group of switches during the voltage application phase.
9. The transformer arrangement of clause 8,
   wherein the controller is configured to open the second group of switches one after another to stepwise decrease the current in the demagnetization phase.
10. The transformer arrangement of one of clauses 5 to 9,
    wherein the controller is configured to open all switches after the demagnetization phase has been terminated.
11. The transformer arrangement of one of clauses 5 to 10,
    wherein a resistance of at least some of the resistors is greater than the resistance of the primary coil.
12. The transformer arrangement of clause 11,
    wherein the resistance of at least some of the resistors is in the range from about 10 Ohm to about 1000 Ohm.
13. The transformer arrangement of clause 11 or 12,
    wherein the resistance of the primary coil is in the range from about 1 Ohm to about 50 Ohm.
14. The transformer arrangement of one of clauses 1 to 13,
    wherein the at least one transformer comprises a plurality of transformers, each transformer of the plurality of transformers comprising a primary coil and a secondary coil;
    wherein the primary coils of the plurality of transformers are connected in series; and
    wherein a node between the primary coils is connected to a reference voltage.
15. The transformer arrangement of clause 14,
    wherein the reference voltage is about half of a supply voltage
16. The transformer arrangement of one of clauses 1 to 15,
    wherein the controller is further configured such that the magnetization phase is one of:
       in the range from about 5 ns to about 30 ns;
       in the range from about 7 ns to about 20 ns;
       in the range from about 9 ns to about 15 ns; and
       about 10 ns.
17. The transformer arrangement of one of clauses 1 to 16,
    wherein the controller is further configured such that the voltage application phase is one of:
       in the range from about 0.5 ns to about 6 ns;
       in the range from about 1 ns to about 4 ns; and
       in the range from about 2 ns to about 3 ns.
18. The transformer arrangement of one of clauses 2 to 17,
    wherein the controller is further configured such that the demagnetization phase is one of:
       in the range from about 5 ns to about 30 ns;
       in the range from about 7 ns to about 20 ns;
       in the range from about 9 ns to about 15 ns; and
       about 10 ns.
19. The transformer arrangement of one of clauses 1 to 18,
    wherein the time constant of the primary coil of the at least one transformer is one of:
       in the range from about 1 ns to about 10 ns;
       in the range from about 2 ns to about 6 ns; and
       in the range from about 3 ns to about 4 ns.
20. The transformer arrangement of one of clauses 5 to 19,
    further comprising:
    another circuit coupled to the controller, the circuit comprising a plurality of subcircuits connected in parallel;
    wherein each subcircuit comprises a series connection of a switch and a resistor;
    wherein a first terminal of each subcircuit is coupled to a reference potential and a second terminal of each subcircuit is coupled to the at least one transformer,
    wherein the another circuit is connected with an opposite polarity to the transformer than the circuit.
21. The transformer arrangement of clause 20,
    wherein the subcircuits of the circuit and of the another circuit share their respective resistors.

22. The transformer arrangement of clause 20 or 21,
wherein the switches of the subcircuits of the circuit and the another circuit are arranged symmetrically to each other.
23. The transformer arrangement of one of clauses 20 to 22, wherein the switches of the subcircuits of the circuit and the another circuit are controlled by the same control signal.
24. The transformer arrangement of one of clauses 20 to 23, wherein the resistance of all resistors are equal.
25. A circuit arrangement comprising:
a first comparator circuit having a first comparator threshold;
a second comparator circuit having a second comparator threshold;
a third comparator circuit having a third comparator threshold;
a control circuit configured to
adapt the first comparator threshold such that the first comparator circuit is in a first comparator output state for a first time portion of a predefined time interval,
adapt the second comparator threshold such that the second comparator circuit is in a first comparator output state for a second time portion of the predefined time interval, wherein the second time portion is longer than the first time portion, and
set the third comparator threshold to be between the first comparator threshold and the second comparator threshold.
26. The circuit arrangement of clause 25,
wherein at least one of the first time portion and the second time portion are the sum of a plurality of time sub-portions.
27. The circuit arrangement of clause 25 or 26, further comprising:
at least one transformer comprising a primary coil and a secondary coil;
wherein the first comparator circuit, the second comparator circuit, and the third comparator circuit are coupled with the secondary coil.
28. The circuit arrangement of one of clauses 25 to 27, wherein the first comparator circuit, the second comparator circuit, and the third comparator circuit are all configured to receive the same signal.
29. The circuit arrangement of one of clauses 25 to 28, wherein at least one of the first comparator circuit and the second comparator circuit are configured as window comparator circuits.
30. The circuit arrangement of one of clauses 25 to 29, wherein the third comparator circuit is configured to provide an evaluation output signal.
31. The circuit arrangement of clause 30, further comprising:
a storage element coupled to the output of the third comparator circuit to store the evaluation output signal.
32. The circuit arrangement of one of clauses 25 to 31, wherein the control circuit is configured to at least one of
adapt the first threshold based on the output signal provided by the first comparator circuit; and
adapt the second threshold based on the output signal provided by the second comparator circuit.
33. The circuit arrangement of clause 32,
wherein the control circuit is configured to at least one of
adapt the first threshold based on a time-based evaluation of the output signal provided by the first comparator circuit; and
adapt the second threshold based on a time-based evaluation of the output signal provided by the second comparator circuit.
34. The circuit arrangement of one of clauses 25 to 33,
wherein the control circuit is configured to at least one of
adapt the first threshold based on the output signal provided by the first comparator circuit, wherein a first signal state of the output signal and a second signal state of the output signal are weighted in a different manner; and
adapt the second threshold based on the output signal provided by the second comparator circuit, wherein a first signal state of the output signal and a second signal state of the output signal are weighted in a different manner
35. The circuit arrangement of clause 33 or 34,
wherein the control circuit is configured to at least one of
adapt the first threshold based on an averaging of the output signal provided by the first comparator circuit; and
adapt the second threshold based on an averaging of the output signal provided by the second comparator circuit.
36. A transformer arrangement for signal transmission, the transformer arrangement comprising:
at least one transformer comprising a primary coil and a secondary coil; the transformer arrangement having a resonance frequency;
a controller configured to terminate driving the primary coil so that the transformer arrangement is oscillating in the resonance frequency;
a switching circuit coupled to the secondary coil and configured to, in a first switching state, let the transformer arrangement oscillate, and, in a second switching state, to decrease the oscillation of the transformer arrangement.
37. The transformer arrangement of clause 36,
wherein driving the primary coil comprises at least one of
a magnetization phase;
a demagnetization phase; and
a voltage application phase.
38. The transformer arrangement of clause 36 or 37, further comprising:
driving the primary coil after a certain time period has passed after terminating driving the primary coil.
39. The transformer arrangement of one of clauses 36 to 38, further comprising:
an amplitude detection circuit coupled to the primary coil.
40. The transformer arrangement of clause 39,
wherein the certain time period is chosen to be long enough to decrease the oscillation if the switching circuit is in a second switching state and long enough that the decrease in oscillation can be detected in the amplitude detection circuit.
41. The transformer arrangement of clause 38 to 40, wherein the time period during which the switching circuit is in the second switching state is shorter than the certain time before starting to drive the coil.
42. The transformer arrangement of one of clauses 36 to 41, wherein the at least one transformer is a coreless transformer.
43. The transformer arrangement of one of clauses 37 to 42, wherein the direction of magnetization of consecutive driving the primary coil phases have opposite polarities.
44. The transformer arrangement of one of clauses 37 to 42, wherein the direction of magnetization of consecutive driving the primary coil phases have the same polarities for a certain number of consecutive driving the primary coil phases.

45. The transformer arrangement of one of clauses 38 to 44, during the certain time before starting to drive the coil a bit is transmitted by detecting if the oscillation has decreased or not.

46. A circuit arrangement, comprising:
    a first signal delay circuit comprising a first component being subject to a process variation, wherein the first component has an effect on the signal delay time of the first signal delay circuit;
    a second signal delay circuit comprising a second component being subject to the same process variation, wherein the second component has an effect on the signal delay time of the second signal delay circuit;
    wherein the first signal delay circuit and the second signal delay circuit are configured to receive the same signal to be delayed;
    wherein the second signal delay circuit has a longer signal delay time than the first signal delay circuit;
    wherein a degree of influence of the process variation of the second component on the signal delay time of the second signal delay circuit is smaller than a degree of influence of the process variation of the first component on the signal delay time of the first signal delay circuit.

47. The circuit arrangement of clause 46,
    wherein the degree of influence of the process variation of the first component on the signal delay time of the first signal delay circuit is inversely proportional to the effect of the first component on the signal delay time of the first signal delay circuit; and
    wherein the degree of influence of the process variation of the second component on the signal delay time of the second signal delay circuit is inversely proportional to the effect of the second component on the signal delay time of the second signal delay circuit.

48. The circuit arrangement of clause 46 or 47, wherein the first component comprises a first resistor; and the second component comprises a second resistor;
    wherein the first resistor and the second resistor have different resistor widths; and
    wherein the first resistor and the second resistor have the same nominal resistance value.

49. The circuit arrangement of one of clauses 46 to 48,
    wherein the first signal delay circuit further comprises a first capacitor having a first capacitance;
    wherein the second signal delay circuit further comprises a second capacitor having a second capacitance;
    wherein the second capacitance is different from the first capacitance.

50. The circuit arrangement of clause 49,
    wherein the second capacitance is higher than the first capacitance.

51. The circuit arrangement of one of clauses 46 to 50, further comprising
    a third signal delay circuit comprising a third component being subject to the same process variation, wherein the third component has an effect on the signal delay time of the third signal delay circuit;
    wherein the degree of influence of the process variation of the third component to the signal delay time of the third signal delay circuit is smaller than the degree of influence of the process variation of the second component to the signal delay time of the second signal delay circuit.

52. The circuit arrangement of one of clauses 46 to 51,
    wherein the first signal delay circuit comprises a series connection of a plurality of sub delay circuits, each sub delay circuit comprising a first component and a signal inverter; and
    wherein the second signal delay circuit comprises a series connection of a plurality of sub delay circuits, each sub delay circuit comprising a second component and a signal inverter.

53. A pulse generating circuit arrangement, comprising:
    a pulse generating circuit configured to provide a pulse; and
    a circuit arrangement, comprising:
        a first signal delay circuit comprising a first component being subject to a process variation, wherein the first component has an effect on the signal delay time of the first signal delay circuit;
        a second signal delay circuit comprising a second component being subject to the same process variation, wherein the second component has an effect on the signal delay time of the second signal delay circuit;
        wherein the first signal delay circuit and the second signal delay circuit are configured to receive the same signal to be delayed;
        wherein the second signal delay circuit has a longer signal delay time than the first signal delay circuit;
        wherein the degree of influence of the process variation of the second component to the signal delay time of the second signal delay circuit is smaller than the degree of influence of the process variation of the first component to the signal delay time of the first signal delay circuit;
    wherein the pulse generating circuit is configured to provide the pulse such that the pulse is started by a signal provided by the first signal delay circuit and such that the pulse is terminated by a signal provided by the second signal delay circuit.

54. The circuit arrangement of clause 53,
    wherein the signal delay time is proportional to a lateral dimension of a resistor.

55. Method for transmitting data in a direction of transmission of a clock signal,
    wherein positive and negative edges of the clock signal are transmitted by pulses with opposite polarity;
    wherein a polarity of the pulses is not inverted when no data is transmitted; and
    wherein the polarity of at least one pulse is inverted when data is transmitted.

56. Method according to clause 55, further comprising:
    detecting if data is transmitted by detecting if a pulse has an unexpected polarity comprises detecting if consecutive pulses have the same polarity.

57. Method according to clause 55 or 56,
    wherein the polarity of only every N-th pulse is inverted when data is transmitted;
    wherein N is one of:
    greater than 2;
    equal to 5;
    equal to 8; and
    equal to 16.

58. Method according to one of clauses 55 to 56,
    wherein the polarity is inverted exactly once after a rising edge of the data and is inverted again exactly once after a falling edge of the data.

59. Method according to one of clauses 55 to 58,
    wherein the data is at least one of:

a configuration parameter of a converter;
a signal to start a conversion of a converter; and
a calibration information.

What is claimed is:

1. A method for transmitting data in a direction of transmission of a clock signal, comprising: transmitting pulses with a first polarity at rising edges of the clock signal and transmitting pulses with a second polarity at falling edges of the clock signal when there is no data being transmitted, wherein the first polarity is opposite to the second polarity, and when there is no data being transmitted, detecting pulses alternating between the first polarity and the second polarity at a receiving circuit; and inverting the first polarity to the second polarity at a rising edge of the clock signal or inverting the second polarity to the first polarity at a falling edge of the clock signal when there is data being transmitted, and when there is data being transmitted, detecting consecutive pulses of a same polarity at the receiving circuit.

2. The method according to claim 1, further comprising:
detecting when data is transmitted by detecting if a pulse has an unexpected polarity, wherein detecting if the pulse has the unexpected polarity comprises detecting if consecutive pulses have the same polarity.

3. The method according to claim 1,
wherein the polarity of only every N-th pulse is inverted when data is transmitted,
wherein N is one of:
an integer greater than 2;
equal to 5;
equal to 8; or
equal to 16.

4. The method according to claim 1,
wherein the polarity is inverted exactly once after a rising edge of the data and is inverted again exactly once after a falling edge of the data.

5. The method according to claim 1,
wherein the data is at least one of:
a configuration parameter of a converter;
a signal to start a conversion of a converter; or
a calibration information.

6. The method according to claim 1, further comprising, generating the pulses by a pulse generating circuit.

7. The method according to claim 6,
wherein the pulse generating circuit comprises a plurality of signal delay circuits.

8. The method according to claim 7,
wherein the each of the plurality of signal delay circuits comprises two delay stages,
wherein the two delay stages operate in an anti-phase manner.

9. The method according to claim 7,
wherein each of the plurality of signal delay circuits are configured to receive a same signal to be delayed.

10. A method for transmitting data in a direction of transmission of a clock signal, comprising: transmitting by pulses with a first polarity at rising edges of the clock signal and transmitting pulses with a second polarity at falling edges of the clock signal when there is no data being transmitted, wherein the first polarity is opposite to the second polarity, and when there is no data being transmitted, detecting pulses alternating between the first polarity and the second polarity at a receiving circuit; and inverting the first polarity to the second polarity at a rising edge of the clock signal or inverting the second polarity to the first polarity at a falling edge of the clock signal when there is data being transmitted, and when there is data being transmitted, detecting consecutive pulses of a same polarity at the receiving circuit; and generating the pulses by a pulse generating circuit, the pulse generating circuit comprising: a first signal delay circuit, and a second signal delay circuit.

11. The method of claim 10,
wherein the first signal delay circuit comprises a first component being subject to a process variation, wherein the first component has an effect on a signal delay time of the first signal delay circuit; and
wherein the second signal delay circuit comprises a second component being subject to the same process variation, wherein the second component has an effect on a signal delay time of the second signal delay circuit.

12. The method of claim 11,
wherein the first signal delay circuit and the second signal delay circuit are configured to receive a same signal to be delayed.

13. The method of claim 12,
wherein the second delay circuit has a longer signal delay time than the first signal delay circuit.

14. The method of claim 13,
wherein the degree of influence of the process variation of the second component to the signal delay time of the second signal delay circuit is smaller than the degree of influence of the process variation of the first component to the signal delay time of the first signal delay circuit.

15. The method of claim 10,
wherein the pulse generating circuit is configured to provide a pulse such that the pulse is started by a signal provided by the first signal delay circuit and such that the pulse is terminated by a signal provided by the second signal delay circuit.

16. The method of claim 11,
wherein the signal delay time of the first signal delay circuit is proportional to a lateral dimension of a resistor in the first signal delay circuit and the signal delay time of the second signal delay circuit is proportional to a lateral dimension of a resistor in the second signal delay circuit.

17. A method for transmitting data in a direction of transmission of a clock signal, comprising:
transmitting the positive and negative edges of the clock signal by pulses with opposite polarity, wherein a polarity of the pulses is not inverted when no data is transmitted, and wherein the polarity of at least one pulse is inverted when data is transmitted; and
generating the pulses by a pulse generating circuit, the pulse generating circuit comprising a first signal delay circuit and a second signal delay circuit, wherein the pulse generating circuit is configured to provide a pulse such that the pulse is started by a signal provided by the first signal delay circuit and such that the pulse is terminated by a signal provided by the second signal delay circuit.

18. The method of claim 17, wherein the first signal delay circuit comprises a first component being subject to a process variation, wherein the first component has an effect on a signal delay time of the first signal delay circuit; and wherein the second signal delay circuit comprises a second component being subject to the same process variation, wherein the second component has an effect on a signal delay time of the second signal delay circuit.

19. The method of claim 18, wherein the first signal delay circuit and the second signal delay circuit are configured to receive a same signal to be delayed.

20. The method of claim 17, wherein the signal delay time of the first signal delay circuit is proportional to a lateral dimension of a resistor in the first signal delay circuit and the signal delay time of the second signal delay circuit is proportional to a lateral dimension of a resistor in the second signal delay circuit.

* * * * *